(12) United States Patent
Cappellani et al.

(10) Patent No.: US 8,313,999 B2
(45) Date of Patent: Nov. 20, 2012

(54) MULTI-GATE SEMICONDUCTOR DEVICE WITH SELF-ALIGNED EPITAXIAL SOURCE AND DRAIN

(75) Inventors: Annalisa Cappellani, Portland, OR (US); Tahir Ghani, Portland, OR (US); Kuan-Yueh Shen, Hillsboro, OR (US); Anand S. Murthy, Portland, OR (US); Harry Gomez, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 239 days.

(21) Appl. No.: 12/646,518

(22) Filed: Dec. 23, 2009

(65) Prior Publication Data

US 2011/0147842 A1  Jun. 23, 2011

(51) Int. Cl.
*H01L 21/336* (2006.01)
(52) U.S. Cl. .................. 438/283; 257/E21.421
(58) Field of Classification Search .................. 438/283; 257/E21.421
See application file for complete search history.

(56) References Cited

U.S. PATENT DOCUMENTS

| | | | |
|---|---|---|---|
| 6,693,009 B1 * | 2/2004 | Kim et al. ................ | 438/257 |
| 2006/0258072 A1 | 11/2006 | Kavalieros et al. | |
| 2006/0286755 A1 | 12/2006 | Brask et al. | |
| 2007/0231983 A1 | 10/2007 | Shifren et al. | |
| 2008/0242037 A1 | 10/2008 | Sell et al. | |
| 2008/0265321 A1 * | 10/2008 | Yu et al. .................... | 257/344 |

FOREIGN PATENT DOCUMENTS

JP   10294457   11/1998

OTHER PUBLICATIONS

International Search Report and Written Opinion for Application No. PCT/US2010/057346 dated Jun. 24, 2011, 7 pages.

* cited by examiner

*Primary Examiner* — Matthew Reames
(74) *Attorney, Agent, or Firm* — Blakely, Sokoloff, Taylor & Zafman LLP

(57) ABSTRACT

A channel strained multi-gate transistor with low parasitic resistance and method of manufacturing the same. A gate stack may be formed over a semiconductor fin having a gate-coupled sidewall height ($H_{si}$), an etch rate controlling dopant may be implanted into a source/drain region of the semiconductor fin adjacent to the gate stack and into a source/drain extension region of the semiconductor fin. The doped fin region may be etched to remove a thickness of the semiconductor fin equal to at least $H_{si}$ proximate a channel region and form a source/drain extension undercut. A material may be grown on the exposed semiconductor substrate to form a regrown source/drain fin region filling the source/drain extension undercut region.

14 Claims, 11 Drawing Sheets

MULTI-GATE SEMICONDUCTOR DEVICE WITH SELF-ALIGNED EPITAXIAL SOURCE AND DRAIN

BACKGROUND

For increased performance, it is often desired to reduce transit time of electrons in N-type metal oxide semiconductor (NMOS) device channel regions and of positive charged holes in P-type MOS device (PMOS) channel regions used in a complementary metal oxide semiconductor (CMOS) devices on a substrate (e.g., integrated circuit (IC) transistor, etc. on a semiconductor substrate). Reduction in channel lengths is a favored way of reducing transit times however because such reductions induce short channel effects, multi-gate devices have been developed in which the channel regions are a portion of a non-planar semiconductor body, or "fin" covered by a gate stack. For such multi-gate devices, the transistor can be gated by the gate stack through a sidewall, as well as a top surface of the fin for better gate control.

With the improved gate control possible with multi-gate designs, the dimension of the fin may be scaled to such a point that the contact to the fin results in a parasitic resistance, $R_{external}$, which can severely limit the operational performance of the multi-gate device. One method of reducing the overall resistance is to dope the fin source/drain regions. For instance, a dopant may be implanted in the source/drain regions and an anneal may be carried out to activate and diffuse the dopant towards the channel region.

Where an implant and diffusion method is used, the ability to control the dopant concentration and location within the fin is limited. Furthermore, the size of other parts of a MOS device, such as the presence of a spacer around the fin, can also greatly hinder reductions in $R_{external}$.

Furthermore, because fin structures are free of a surrounding substrate, strain-inducing mobility enhancement techniques which have proved advantageous in the past for planar devices may not be readily adaptable to multi-gate devices. Without the ability to enhance channel mobility via strain (e.g., uniaxial or biaxial), the performance improvement in multi-gate devices resulting from the smaller channel lengths possible would be at least partially offset by a comparatively lower channel mobility. Accordingly, improved methods and structures are needed to overcome these limitations in the source/drain fin regions.

BRIEF DESCRIPTION OF THE DRAWINGS

Embodiments of the invention, both as to organization and method of operation, together with objects, features, and advantages thereof, may best be understood by reference to the following detailed description when read with the accompanying drawings in which.

Figure 1:
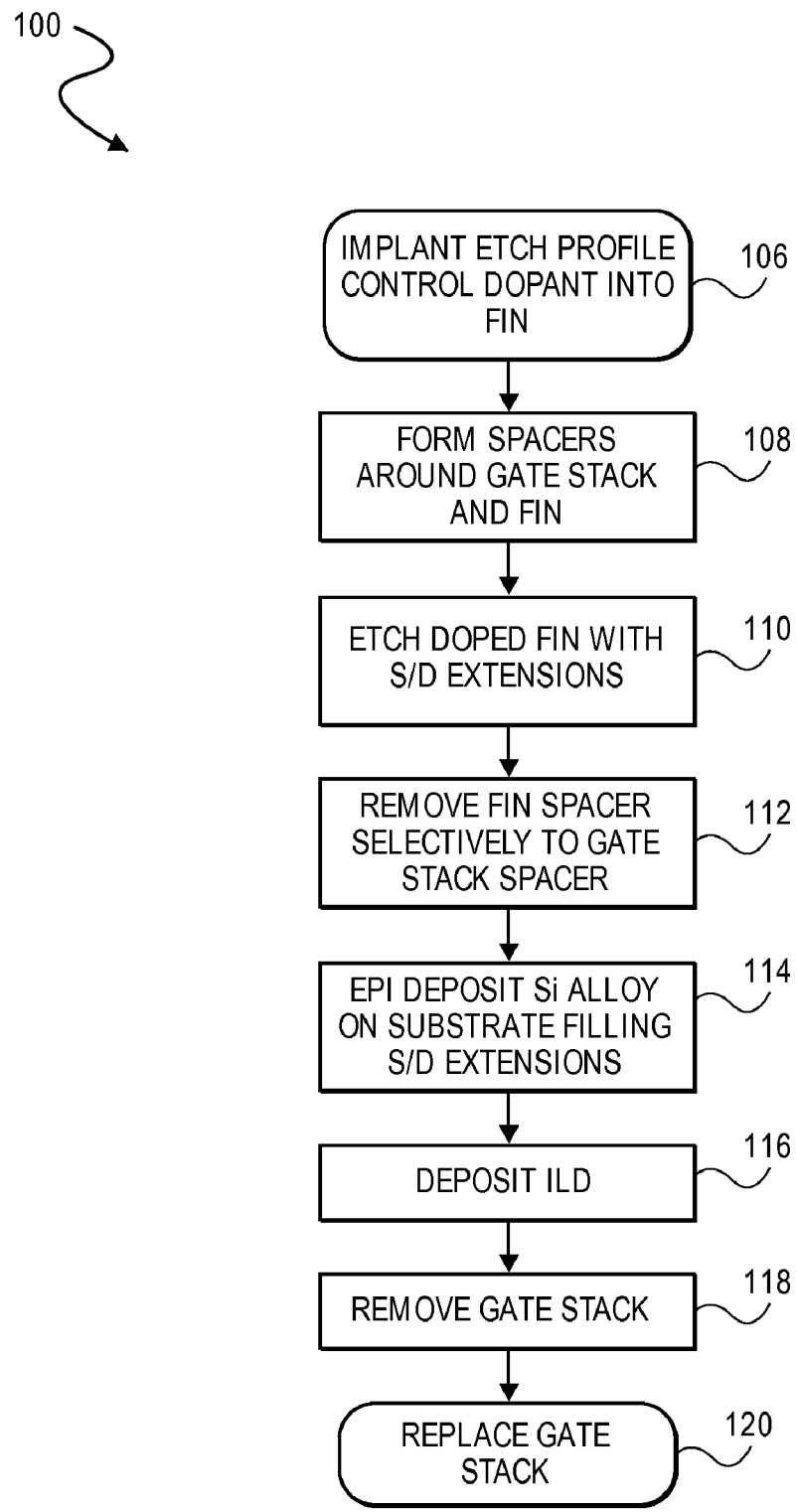
FIG. 1 is a flow diagram depicting a method of forming source and drain epitaxial extensions in a multi-gate device, in accordance with an embodiment of the invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

Described herein are systems and methods of forming epitaxial source and drain extensions in a multi-gate MOS device (e.g., "finfet"). In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the illustrative embodiments of the present invention; however, the order of description should not be construed to imply that these operations are necessarily order dependent. In particular, these operations need not be performed in the order of presentation.

Disclosed herein is a multi-gate device including epitaxial source and drain fin regions having a vertical thickness equal to approximately Hsi proximate the channel and which may further include a portion of the epitaxial source and drain fin regions regrown to be disposed under the gate dielectric layer of the transistor. FIG. 1 is a flow diagram depicting a method 100 of forming such regrown source/drain regions, in accordance with an embodiment of the invention including source and drain epitaxial extensions. FIGS. 2-9 depict a multi-gate device after particular operations of the method 100 as it is performed.

Method 100 begins with an ion implantation operation 106 carried out to form doped regions of a semiconductor fin adjacent to a gate stack disposed on the semiconductor fin. The doped regions are to be removed in preparation for regrowing source and drain regions for the multi-gate MOS transistor being formed. When exposed to an appropriate etchant, the doped regions will have an etch rate that is higher than the etch rate of the surrounding substrate and channel semiconductor material which enables excellent control of the etch profile allowing shaping of the regrown source and drain regions for optimal sub-fin leakage characteristics and channel strain.

Figure 2A:
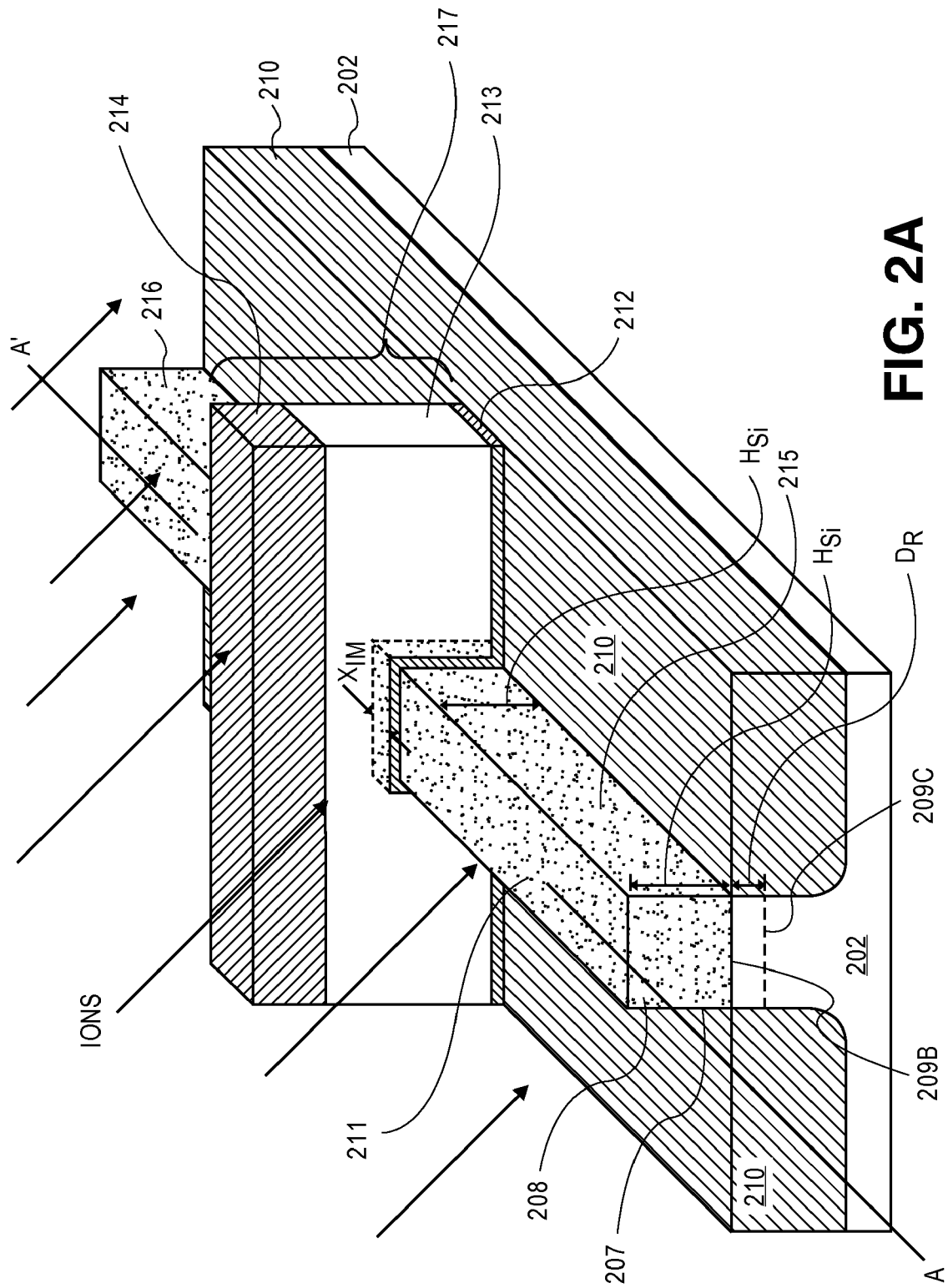
FIG. 2A is an isometric view of a stage in the fabrication of a multi-gate device corresponding to operation 106 in FIG. 1, in accordance with an embodiment of the invention.
Figure 2B:
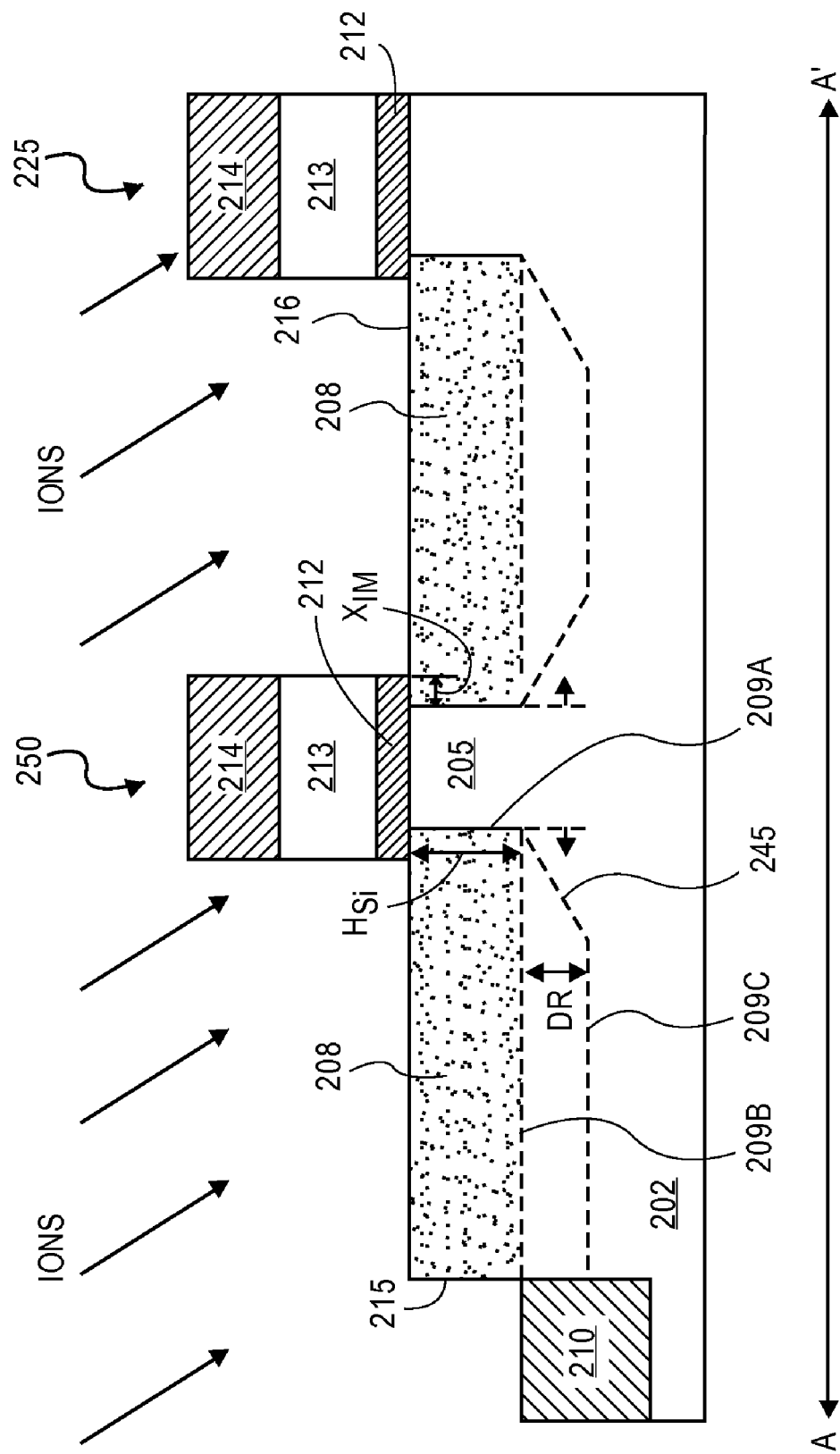
FIG. 2B is a cross-sectional view of the device depicted in FIG. 2A.

FIG. 2A is an isometric view of a gate stack formed over a semiconductor fin as provided at operation 106 in FIG. 1, in accordance with an illustrative embodiment of the invention. FIG. 2B represents a cross-sectional view of the multi-gate transistor of FIG. 2 taken along the A-A' reference line illustrated in FIG. 2A. As shown in FIGS. 2A and 2B, a non-planar semiconductor body over a substrate 202 forms a fin with a parallelepiped shape having a sidewall 207 with a sidewall height, $H_{si}$, and a top surface 211 extending beyond an adjacent isolation region 210. The top surface 211 and sidewall 207 are apportioned into a non-planar source region 215 and non-planar drain region 216 with a channel region there between covered by a gate stack 217. For the multi-gate transistor, the channel is to be capacitively controllable at least through sidewall 207 such that the $H_{si}$ represents the gate-coupled channel sidewall height. The top surface 211 may also be capacitively controllable by an overlying gate stack for greater sub-threshold control. In the exemplary embodiment, the gate stack 217 is sacrificial and subsequently removed for a replacement metal gate process. However, the methods described herein may also be adapted to embodiments in which the gate stack 217 is not sacrificial but rather retained in the final multi-gate device.

In the exemplary embodiment, the substrate 202 is a bulk silicon or a silicon-on-insulator substructure. The semiconductor substrate 202 may, however, also be formed using alternate materials, which may or may not be combined with silicon, that include, but are not limited to, germanium, indium antimonide, lead telluride, indium arsenide, indium phosphide, gallium arsenide, or gallium antimonide. Although a few examples of materials from which the substrate may be formed are described, any material known in the art that upon which a semiconductor device may be built falls within the spirit and scope of the present invention.

As shown, the gate stack 217 includes a gate dielectric 212, a gate electrode 213, and a gate cap 214. The gate dielectric 212 may be a silicon dioxide, silicon nitride, silicon oxynitride, or a dielectric material having a dielectric constant greater than 10 (i.e., "high-k"). Examples of high-k gate dielectric materials that may be used include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate electrode 213 may be poly-silicon, poly-germanium, a metal, or a combination thereof. The gate cap 214 may be any conventional hard mask dielectric material such as, silicon oxide, silicon nitride, and the like.

FIG. 2B illustrates how a first non-planar body 250 and a second non-planar body 225 may be formed on opposite side of the doped fin region 208. The second non-planar body 225 may either be the basis for another functional transistor or merely a dummy structure providing a means to control one or more aspects of the fabrication of the first non-planar body 250. As such, FIG. 2B illustrates two different exemplary interfaces of the doped fin region 208: an interface with the isolation region 210 and an interface with a second non-planar semiconductor body. It should be appreciated that the doped fin region 208 may have an end distal from the first non-planar body 250 that abuts either one of these two interfaces.

The dopant used in the ion implantation operation 106 is chosen based on its ability to increase the etch rate of the semiconductor fin material in which it is implanted. The specific dopant may therefore vary based on the substrate material and the etchant used in a subsequent etching of the doped fin. Exemplary dopants increase the etch rate of silicon, germanium, or indium antimonide. In particular embodiments, specific dopants include, but are not limited to, carbon, phosphorous, and arsenic. For instance, carbon may be used at a dosage that ranges from $1 \times 10^{14}$ to $1 \times 10^{16}$ atoms/cm$^3$. Phosphorous may be used at a dosage that ranges from $1 \times 10^{14}$ to $5 \times 10^{15}$ atoms/cm$^3$. Arsenic may be used at a dosage that ranges from $1 \times 10^{14}$ to $5 \times 10^{15}$ atoms/cm$^3$. The ion implantation may be performed in a substantially vertical direction (i.e., a direction perpendicular to substrate). However, in some embodiments, at least a portion of the ion implantation process may occur in an angled direction to implant ions below the gate stack 217. For non-replacement gate embodiments, the gate cap 214 may be formed of a sufficient thickness to prevent doping of the gate electrode 213. With the etch profile control dopants present in the semiconductor fin, an anneal may be carried out to complete operation 106. The anneal drives the dopants further into the semiconductor fin and reduces any damage sustained by the substrate during the ion implantation. The exemplary anneal is between 700° C. and 1100° C. for a duration of up to one minute, for instance, a duration of five seconds.

The size of the doped fin region 208, including the depth, may vary based on the requirements of the multi-gate MOS transistor being formed. As shown in FIGS. 2A and 2B, following the implant operation 106, the doped fin region 208 proximate to the channel region 205 extends to a depth of the semiconductor fin no greater than the height $H_{si}$. In the exemplary embodiment illustrated in FIG. 2B, the doped fin region 208 forms a substantially perpendicular sidewall interface 209A with the channel region 205. The substantially perpendicular sidewall interface 209A extends through approximately the entire thickness of the semiconductor fin of height $H_{si}$. In one embodiment, the doped fin region 208 further forms a bottom interface 209B with the subjacent semiconductor substrate 202 that is substantially planar with a top surface of the isolation region 210. In another embodiment, the doped fin region 208 forms a bottom interface 209C with the subjacent semiconductor substrate 202 that is an amount $D_R$ below a top surface of the isolation region 210. In either case, there may be a transitional interface 245 which slopes laterally away from the gate stack 217 with the transitional interface 245 preferably beginning a distance which is not more than $H_{si}$ below the gate dielectric 212. As further shown in FIGS. 2A and 2B, portions of the doped fin region 208 are sited below, or subjacent to, the gate stack 217 by an amount, $X_{IM}$. In the exemplary embodiment, the amount by which the doped fin region 208 overlap the gate stack 217 is substantially constant for the height $H_{si}$ (along the interface 209A) with the amount of overlap decreasing at depths greater than $H_{si}$ (forming the transitional interface 245).

Figure 3A:
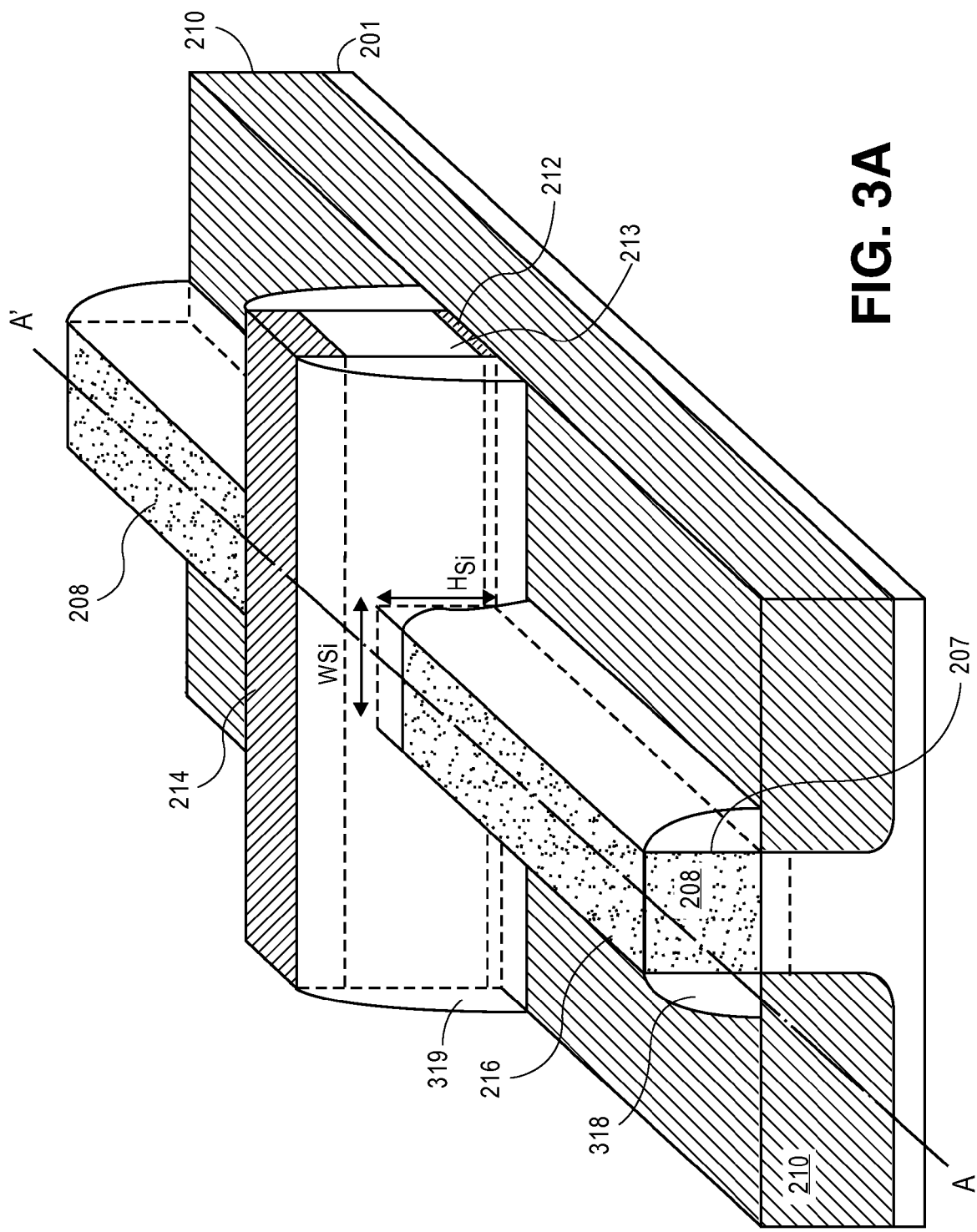
FIG. 3A is an isometric view of a stage in the fabrication of a multi-gate device corresponding to operation 108 in FIG. 1, in accordance with an embodiment of the invention.
Figure 3B:
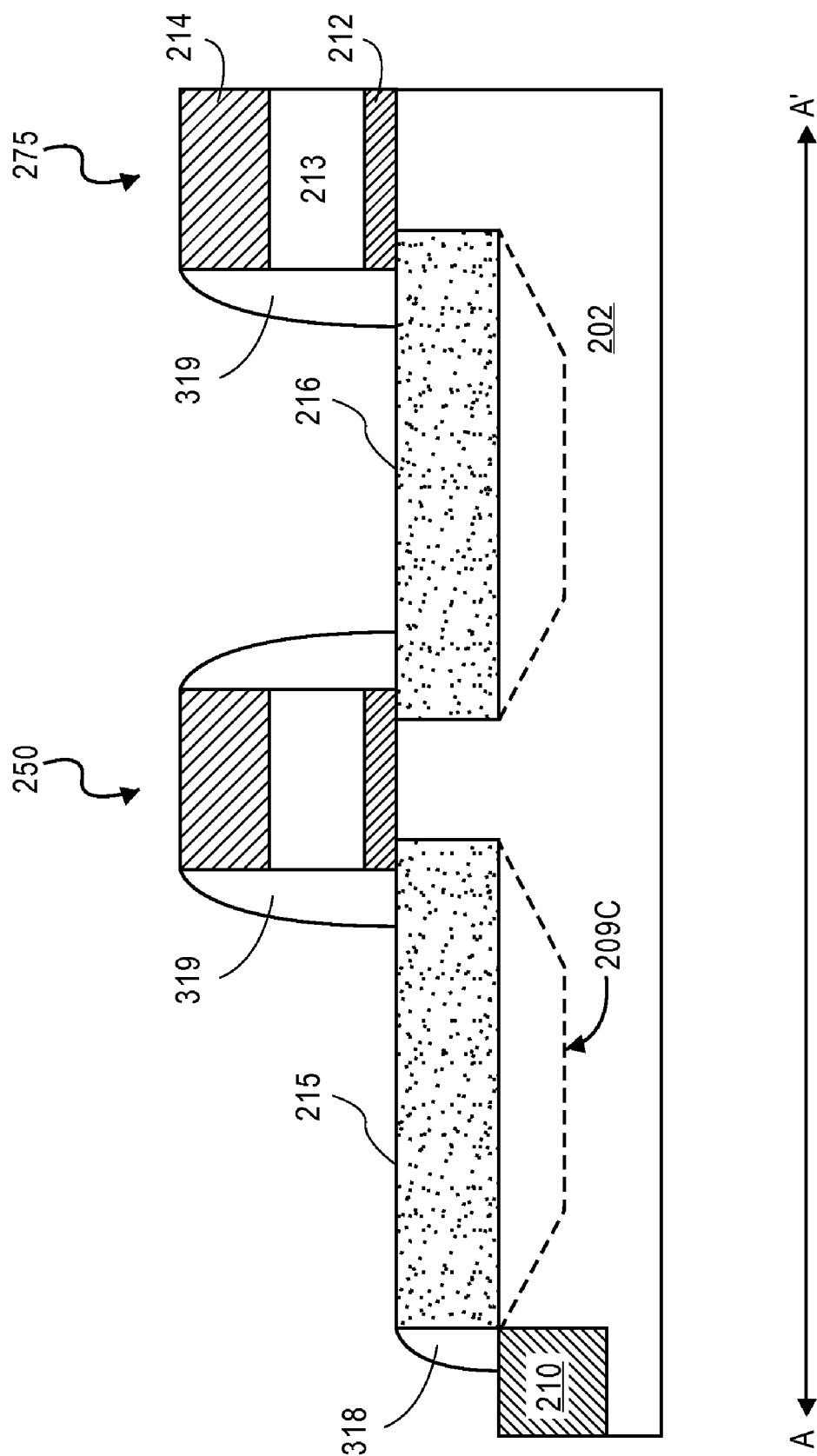
FIG. 3B is a cross-sectional view of the device depicted in FIG. 3A.

Returning to FIG. 1, at operation 108, spacers are formed on either side of the gate stack and the semiconductor fin. The spacers may be formed using conventional dielectric materials, including but not limited to silicon oxide or silicon nitride. The width of the spacers may be chosen based on design requirements for the multi-gate transistor being formed. FIGS. 3A and 3B illustrate a gate stack spacer 319 formed on sidewalls of the gate stack 217. Formation of the gate stack spacer 319 also forms a fin spacer 318 on the sidewalls of the semiconductor fin, in particular adjacent to the doped fin region 208, and disposed on the isolation region 210.

Returning to FIG. 1, an etch process is performed at operation 110 to etch the doped fin region. In particular embodiments, this etch process may also form a cavity below the gate stack in which regrown source/drain regions may be subsequently formed. The etch operation 110 uses etchants that complements the dopant used in the ion implantation process to increase the etch rate of the doped regions. This enables the etching process to remove the doped fin region at a faster rate than the remainder of the undoped (or more lightly doped) substrate. As such, with an appropriate increase in etch rate, the etching process can selectively remove substantially the entire semiconductor fin (i.e., entire height $H_{si}$ over the entire channel width $W_{si}$, as shown in FIG. 3A) and retain only the channel region with good profile and depth control. This includes portions of the doped regions that undercut the gate stack spacer and the gate dielectric, thereby defining a self-aligned source/drain fin extensions of the multi-gate transistor.

In accordance with an exemplary embodiment of the invention, the etch operation 110 includes is a dry etch using a chlorinated chemistry in combination with at least one of $NF_3$, HBr, $SF_6$ and Ar or He used as a carrier gas. The flow rate for the active etchant species may vary between 50 and 200 standard cubic centimeters per minute (SCCM) while the flow rate of the carrier gas may vary between 150 and 400 SCCM. A high energy plasma may be employed at a power that ranges from 700 W to 1100 W with zero or an RF bias of less than 100 W. The reactor pressure may range from around 1 pascal (Pa) to around 2 Pa. In further embodiments, the etch operation 110 further includes a wet etch to clean and further etch the semiconductor substrate 202 where the doped fin region 208 where removed. Conventional wet etch chemistries known in the art for cleaning silicon and oxide material may be used. For instance, wet etch chemistries capable of removing silicon along its crystallographic planes may be used.

Figure 4A:
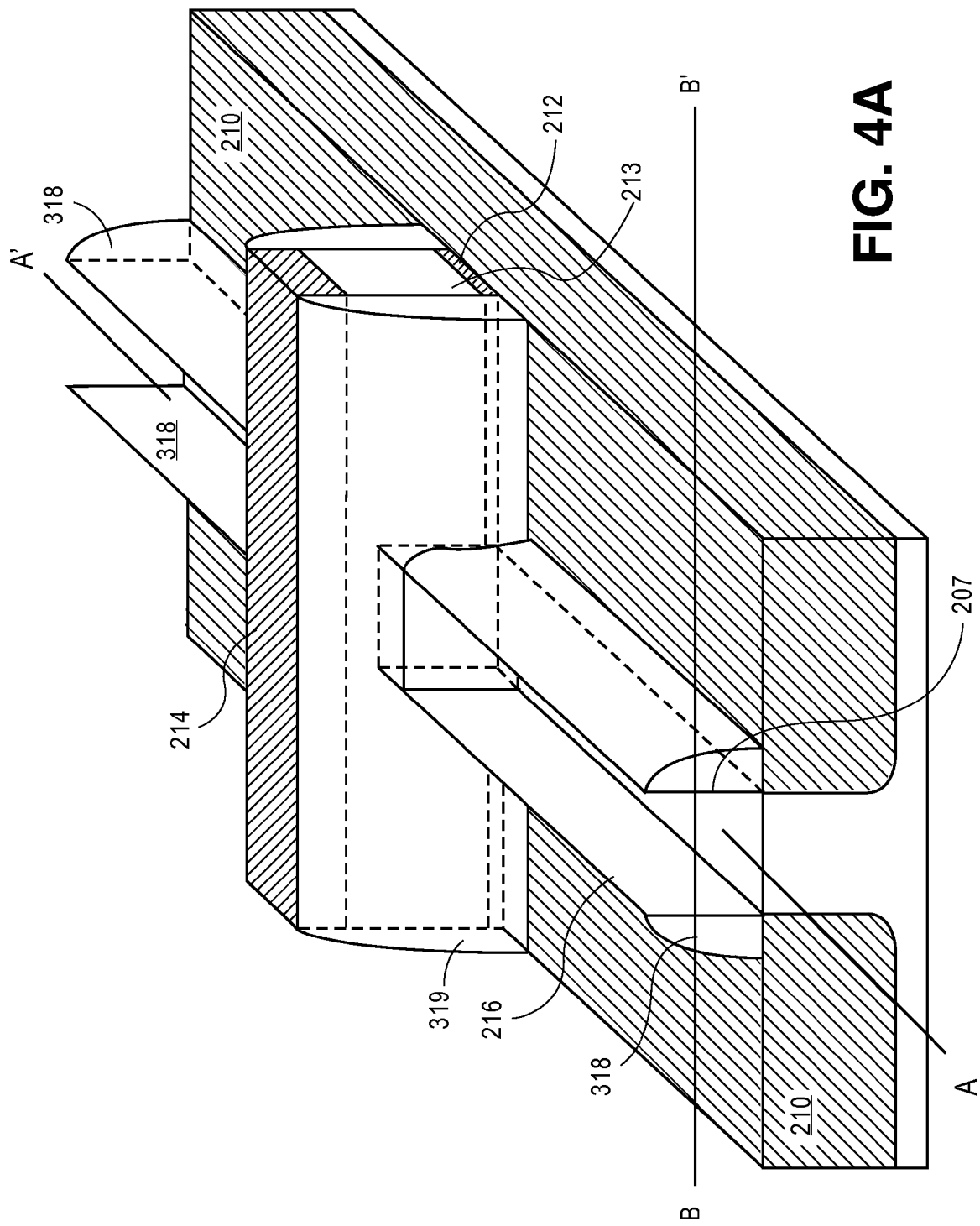
FIG. 4A is an isometric view of a stage in the fabrication of a multi-gate device corresponding to operation 110 in FIG. 1, in accordance with an embodiment of the invention.
Figure 4B:
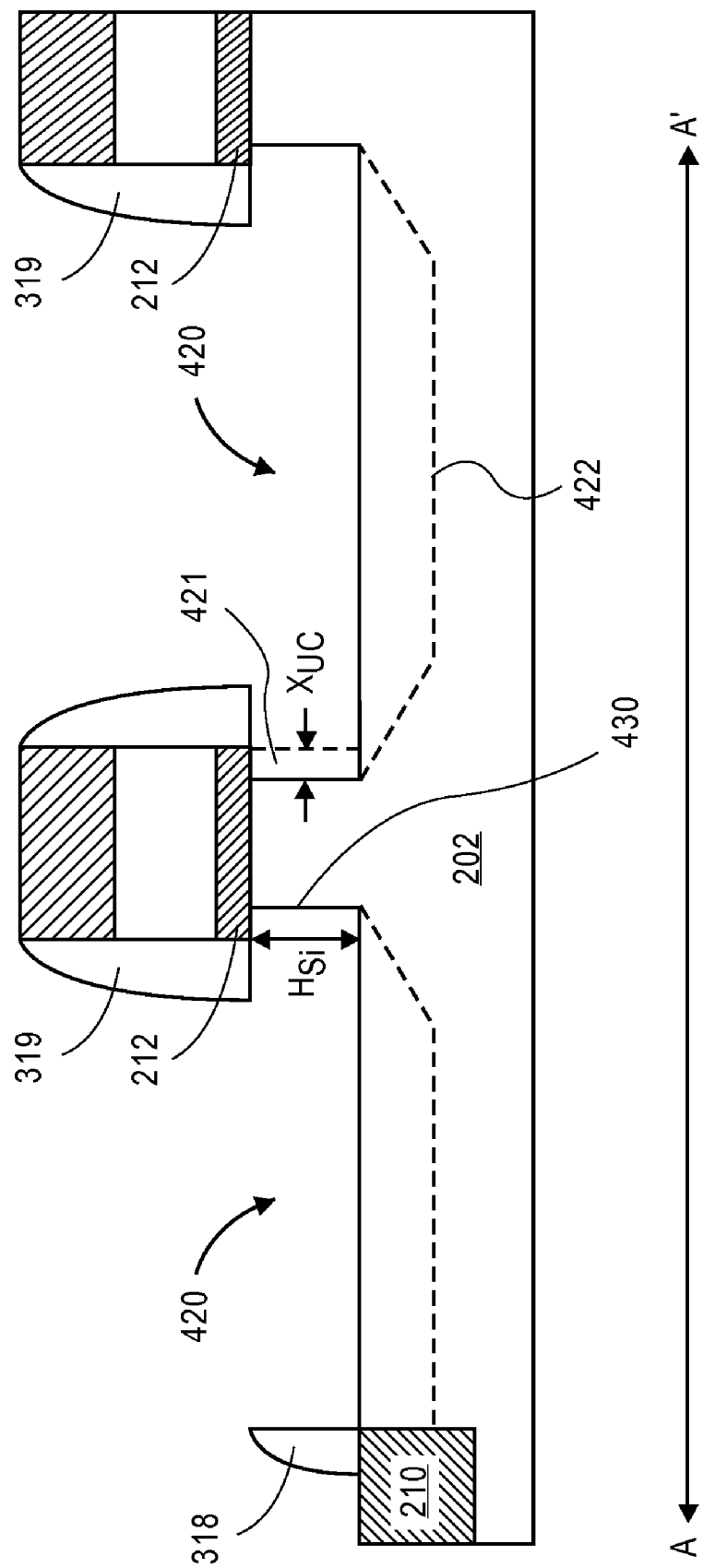
FIG. 4B is a view of the cross-section along the B-B' plane of the device depicted in FIG. 4A, in accordance with an embodiment of the invention.
Figure 4C:
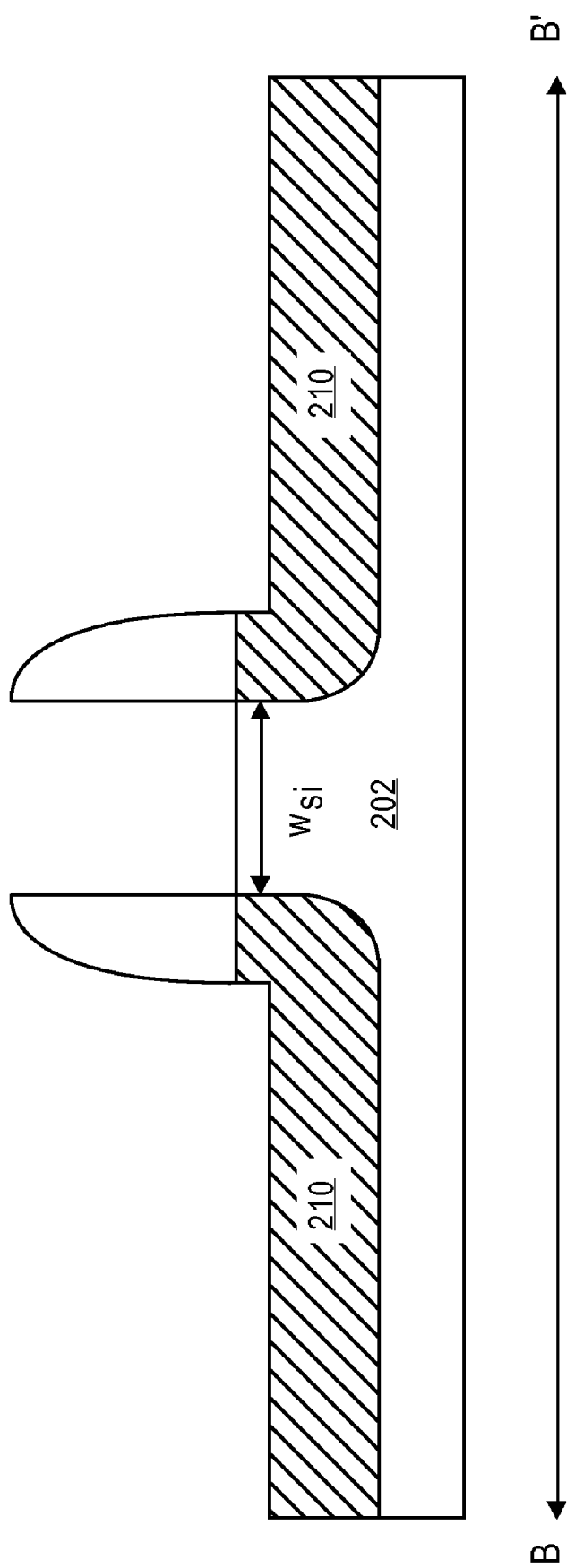
FIG. 4C is a view of the cross-section along the B-B' plane of the device depicted in FIG. 4A, in accordance with an embodiment of the invention.

FIGS. 4A, 4B and 4C depict the multi-gate device after the etch operation 110 is performed. In the exemplary embodiment, the source/drain extension cavity 421 is etched with an undercut amount of $X_{UC}$ that is controlled on the basis of the implant profile $X_{IM}$ to be substantially constant over an etched depth that is approximately equal to $H_{si}$. In particular embodiments, $X_{UC}$ can range from greater than 0 to 12 nm for a gate length range of 15 to 40 nm while the gate stack length (dimension parallel to $X_{UC}$) over an entire gate coupled channel height $H_{si}$ is, as an example, approximately 25 nm. In an alternative embodiment where traditional tip implants are to be employed and the regrown source/drain is not to interface with the channel directly, $X_{UC}$ is 0. Etching the source/drain fin regions and forming a source/drain extension undercut amount $X_{UC}$ which is approximately constant over $H_{si}$ enables a greater amount of stress to be applied to the channel region 205 than if the source/drain extension cavity 421 had a depth less than $H_{si}$ or if the undercut amount $X_{UC}$ was reduced (e.g., 0 for the tip implant embodiments). Application of greater stress has the effect of increasing $I_{d,sat}$ for the multi-gate transistor. Etching the source/drain fin regions down to $H_{si}$ also maximizes the area of the channel region 205 available to be contacted by a subsequently regrown source/drain region for reduced $R_{external}$.

However, it has also been found that sub-fin leakage (source-to-drain leakage below channel region 205) is a function of the fin etch depth proximate to the channel region 205 with such leakage increasing significantly where the undercut amount $X_{UC}$ is not reduced for depths greater than $H_{si}$ (as measured from the interface of the gate dielectric 212). Thus, the depth and profile of the fin etch should be optimized between stress and channel leakage. As such, in one embodiment providing a substantially flat-bottomed etch profile, the thickness of the doped fin region 208 removed during the etch operation 110 should not be greater than $H_{si}$ so that both the source/drain cavity 420 and the source/drain extension cavity 421 are substantially planar to, or flush with, an adjacent isolation region 210 disposed under the gate stack 217 (FIG. 2A). In certain embodiments, the surface of the isolation region 210 not covered by the gate stack 217 is recessed as a result of the fabrication processes.

For embodiments where the implant and/or etch is engineered to provide for a tapered or sloped profile away from the channel region 205, the thickness of the doped fin region 208 removed during the etch operation 110 may be greater than $H_{si}$ at a point distal from the channel region 205. For such an embodiment, the source/drain cavity 420 is recessed (dashed line 422) an amount below the gate stack protected areas of the isolation region 210 while a portion of source/drain extension cavity 421 proximate to the channel region 205 is substantially planar to, or flush with, areas of the isolation region 210 disposed under the gate stack (corresponding to a source/drain recess depth approximately equal to $H_{si}$). For this embodiment, the undercut amount $X_{UC}$ of the source/drain extension cavity 421 decreases as a function of etch depth greater than the threshold etch depth of $H_{si}$ (as illustrated with the slope in 422).

At operation 112, the fin spacer 318 is removed. Depending on the embodiment, the spacer removal operation 112 is either performed prior to the doped fin etch operation 110, during the doped fin etch operation 110, or after the doped fin etch operation 110. In the embodiment shown in FIGS. 4A, 4B and 4C, the source/drain etch operation 110 is selective to dielectric materials (e.g., to maintain dielectric encapsulation of the gate electrode 213) and both the gate stack spacer 319 and the fin spacer 318 are retained after the etch operation 110. In such an embodiment, the fin spacer 318 remains as a dielectric veil surrounding the source/drain cavity 420. For an embodiment where the source/drain etch operation 110 is less selective to dielectric materials, the fin spacer 318 may be partially or completely removed during the doped fin etch operation 110 (in which case operations 110 and 112 of FIG. 1 are performed simultaneously).

Figure 5A:
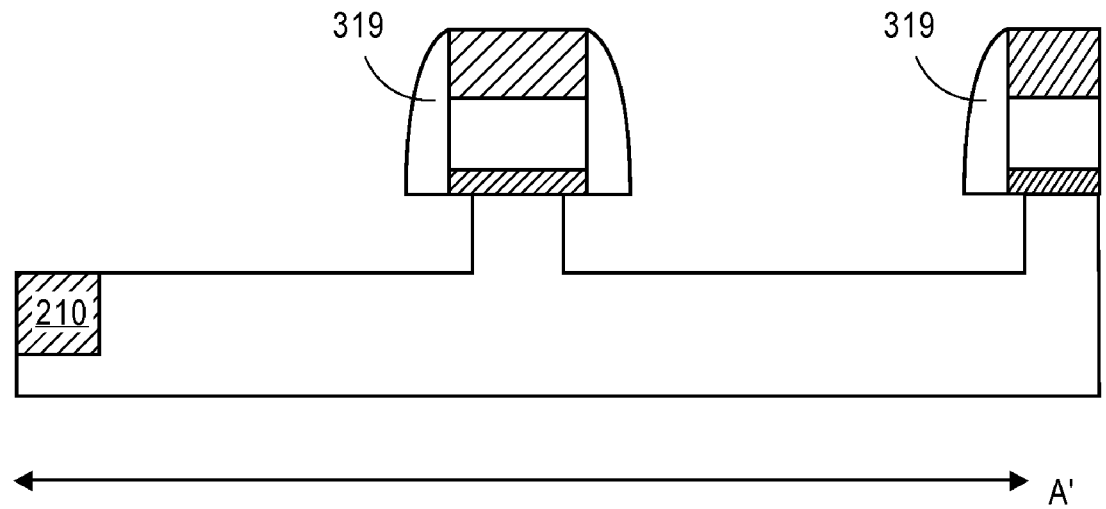
FIG. 5A is a first cross-sectional view of a stage in the fabrication of a multi-gate device corresponding to operation 112 in FIG. 1, in accordance with an embodiment of the invention.
Figure 5B:
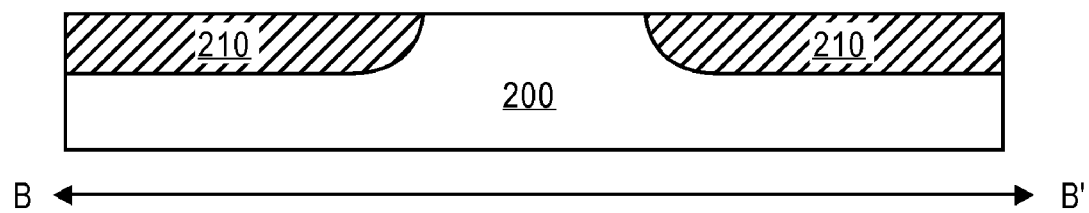
FIG. 5B is a second cross-sectional view, orthogonal to the view in FIG. 5A, of a stage in the fabrication of a multi-gate device corresponding to operation 112 in FIG. 1, in accordance with an embodiment of the invention.

For embodiments where at least some portion of the fin spacer 318 remain after operation 110, the fin spacer 318 is removed preferentially to the semiconductor substrate 202 in a manner which retains the gate stack spacer 319 and the gate cap 214, as further depicted in FIGS. 5A and 5B. In one embodiment, an isotropic etch process (dry or wet) is utilized to etch the fin spacer 318. For such embodiments, the fin spacer 318 may be etched away from the surface of the isolation region 210 while the gate stack spacer 319 and the gate cap 214 are only partially thinned. With the gate electrode 213 remaining encapsulated following removal of the fin spacer 318 the gate electrode does not provide a seed surface during a subsequent source/drain regrowth.

Figure 6A:
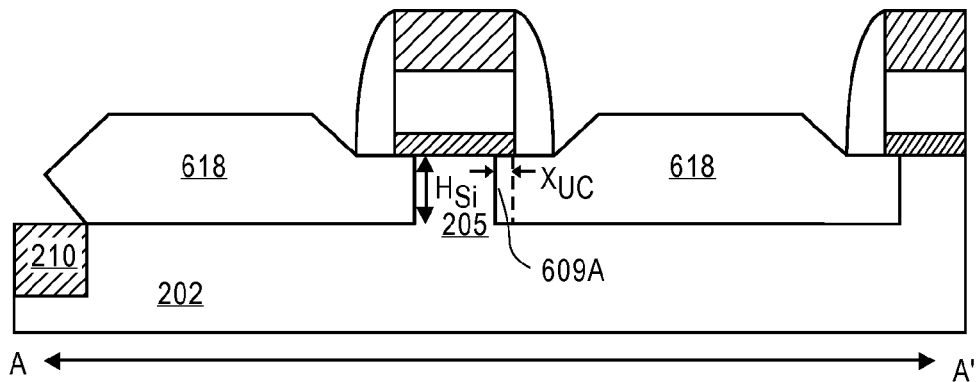
FIG. 6A is a first cross-sectional view of a stage in the fabrication of a multi-gate device corresponding to operation 114 in FIG. 1, in accordance with an embodiment of the invention.
Figure 6B:
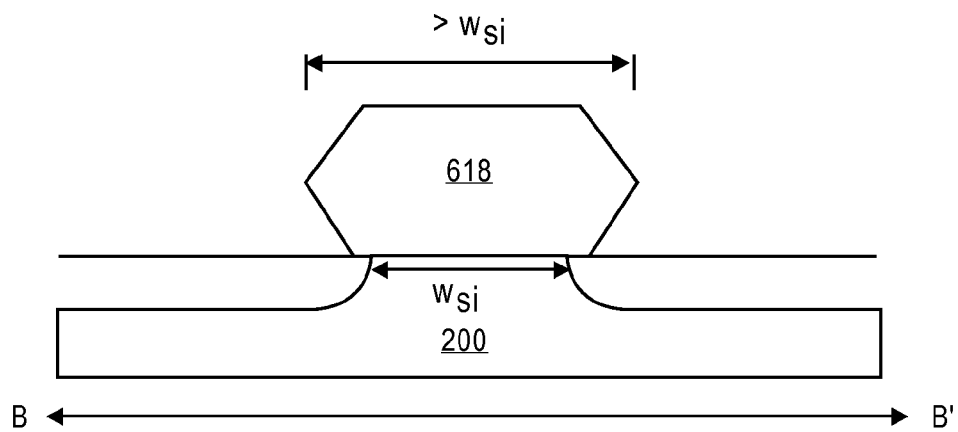
FIG. 6B is a second cross-sectional view, orthogonal to the view in FIG. 6A, of a stage in the fabrication of a multi-gate device corresponding to operation 114 in FIG. 1, in accordance with an embodiment of the invention.
Figure 7:
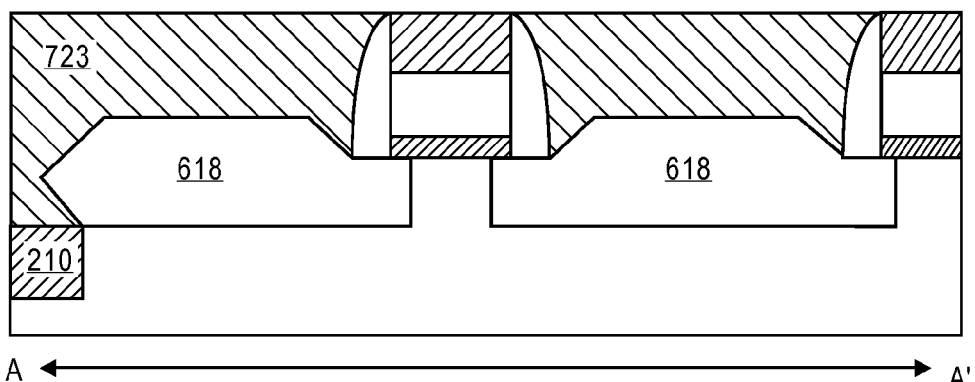
FIG. 7 is a cross-sectional view of a stage in the fabrication of a multi-gate device corresponding to operation 116 in FIG. 1, in accordance with an embodiment of the invention.

Returning to FIG. 1, at operation 114 the source/drain cavity 420, including the source/drain extension cavity 421, is filled with a material using a selective epitaxial deposition process to form regrown source/drain fin. In an embodiment, as depicted in FIGS. 6A and 6B, the material forming the source/drain fin 618 induces a strain on the channel region 205. In accordance with particular embodiments, the material forming the regrown source/drain fin 618 contains silicon and follows the crystallinity of the substrate 202 but has a lattice spacing that is different than the lattice spacing of the substrate 202. The difference in lattice spacing induces a tensile or compressive stress in the channel region of the MOS transistor that is accentuated by depositing the silicon alloy in the source and drain extension cavity 421. As is known to those of skill in the art, deciding whether to induce a tensile stress or a compressive stress will depend on whether an NMOS or a PMOS transistor is being formed.

The epitaxial deposition operation 114 therefore regrows source/drain regions and source/drain extensions in one process. For embodiments in which the regrown source/drain regions fill an undercut having an $X_{UC}$ that is greater than 0, the epitaxially regrown source/drain fin 618 may have a more abrupt interface 609A than embodiments which employ tip implants to place dopant at interface to the channel (e.g., $X_{UC}$ is 0). In other words, the interface 609A between the epitaxial regrown source/drain fin 618 and the channel region 205 is well-defined by the regrowth process. On one side of the interface 609A is the epitaxially deposited doped silicon material and on the other side of the interface 609A is the substrate material that makes up the channel region 205. The dopants in the regrown source/drain fin 618 may diffuse into the channel region 205 but such diffusion is engineered by controlling the location of the $X_{UC}$ dimension (i.e., location of the interface 209A with the channel region 205) and by optimizing the temperature of the EPI deposition and subsequent thermal treatments. This enables the regrown source/drain regions to bring the heavily doped source/drain material in very close proximity to the channel region 205 relative to conventional techniques (i.e., the undercut amount $X_{UC}$ may overlap the gate stack extensively). As will be appreciated by those of skill in the art, this in turn enables the channel length to be scaled down without having to reduce the dimension of the gate stack.

In an embodiment, the source/drain regions are regrown to a thickness of at least $H_{si}$. In a further embodiment, the source/drain regions are regrown to a width of at least $W_{si}$, and preferably to a width greater than $W_{si}$, as depicted in FIG. 6B. Forming the regrown source/drain fin 618 at the height $H_{si}$ and in relatively close proximity to the channel region 205 imparts a large hydrostatic stress on the channel. As previously described, this stress increases the strain within the channel region 205, thereby increasing mobility in the channel and increasing drive current. In the exemplary embodiment with the fin spacer 318 removed, the source/drain regions are regrown defect free or with significantly lower defects than possible with sidewall growth constraints. In the absence of fin spacer 318, the lateral epitaxial growth of the regrown source/drain fin 618 is unobstructed, thereby allowing the formation of {111} facets and continued growth on {111} planes to extend over a portion of isolation region 210, as further shown in FIG. 6A. Of course, the epitaxial growth facets are dependent on the crystal orientation of the underlying substrate 202 such that different substrate orientations will result in different epitaxial facets. The width of the regrown source/drain fin 618 is therefore greater than the width of the doped fin region 208 which was removed. Thus, the channel region 205 has a width $W_{si}$ that is smaller than the width of the regrown source/drain fin 618. For instance, the width of the regrown source/drain fin 618 may be between 10% and 100% wider than $W_{si}$ to optimize performance. In one embodiment, the width of the regrown source/drain fin 618 is greater than $W_{si}$ along at least half the height $H_{si}$. In other words, as the regrown source/drain fin 618 is formed, it reaches a width greater than $W_{si}$ by the time the regrown source/drain thickness is approximately $\frac{1}{2}H_{si}$. The relatively wider regrown source/drain fin 618 provides for a larger surface area upon which a metallized contact may be made, thereby reducing $R_{external}$ relative to a source/drain region having a width equal to $W_{si}$. The greater width of the regrown source/drain fin 618 also increases the amount of strain placed on the channel region 205.

In certain embodiments, a silicon alloy is employed for the regrown source/drain fin 618. The alloy may impart strain on the channel region 205. Depending on the embodiment, the alloy may be in-situ Boron doped silicon germanium (e.g., for a PMOS multi-gate transistor with a compressively strained channel), in-situ Carbon and Phosphorus doped silicon (e.g., for a NMOS multi-gate transistor with a tensilely strained channel), or in-situ Phosphorus doped silicon. In alternate implementations, other silicon alloys may be used. For instance, alternate silicon alloy materials that may be used include, but are not limited to, nickel silicide, titanium silicide, cobalt silicide, and may be doped with one or more of boron and/or aluminum. In still other embodiments, non-silicon materials are employed (e.g., pure germanium, germanate, etc.).

For one NMOS transistor embodiment, the regrown source/drain fin 618 may be filled with carbon doped silicon. The carbon doped silicon may be epitaxially and selectively deposited. In further implementations, the carbon doped silicon may be further doped in situ with phosphorous. The carbon concentration may range from 0.5 atomic % to 5.0 atomic %. The phosphorous concentration may range from $5 \times 10^{19}/c^{m3}$ to $3 \times 10^{21}/c^{m3}$. The thickness of the carbon doped silicon may range from 400 Å to 1200 Å. The carbon and phosphorous doped silicon may be denoted as $(C, P_y, S_{i(1-y)})$. The deposition of the doped $(C, P_y, S_{i(1-y)})$ source and drain regions may be carried out in chemical vapor deposition reactor using a co-flown or cyclically deposition and etch sequenced process. In one example, the film is formed by cyclical deposition and etch based on silane ($Si_{H4}$), diclholorosilane, disilane, $PH_3$, $CH_3SiH_3$, and chlorine ($Cl_2$) or HCl chemistry.

For one PMOS transistor embodiment, the regrown source/drain fin 618 may be filled with silicon germanium. The silicon germanium may be epitaxially deposited. The germanium concentration may range from 10 atomic % to 80 atomic %. In further implementations, the silicon germanium may be further doped in situ with boron. The boron concentration may range from $2 \times 10^{19}/cm^3$ to $2 \times 10^{21}/cm^3$. The thickness of the silicon germanium may range from 40 Å to 1500 Å. Deposition of the doped silicon germanium may be carried out in a CVD reactor, an LPCVD reactor, or an ultra high vacuum CVD (UHVCVD). The reactor temperature may fall between 600° C. and 800° C. and the reactor pressure may fall between 1 and 760 Torr. The carrier gas may consist of hydrogen or helium at a flow rate that ranges between 10 and 50 SLM.

As will be appreciated by those of skill in the art, the multi-gate MOS transistor may undergo further processing, such as replacement gate oxide processes, replacement metal gate processes, annealing, or salicidation processes, that may further modify the transistor and/or provide the necessary electrical interconnections. For instance, after the epitaxial deposition of the regrown source/drain fin 618, an interlayer dielectric (ILD) may be deposited and planarized over the multi-gate device at operation 116 (FIG. 1), and as further shown in FIG. 7. Because the fin spacer 318 was removed, the ILD 723 is deposited directly on sidewalls of the regrown source/drain fin 618, and as such, is in contact both with a sidewall of the gate stack spacer 319 and with a sidewall portion of the regrown source/drain fin 618 located within the height $H_{si}$. The ILD 723 may be formed using materials known for the applicability in dielectric layers for integrated circuit structures, such as low-k dielectric materials. Such dielectric materials include, but are not limited to, oxides such as silicon dioxide ($SiO_2$) and carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer 723 may include pores or other voids to further reduce its dielectric constant.

Figure 8:
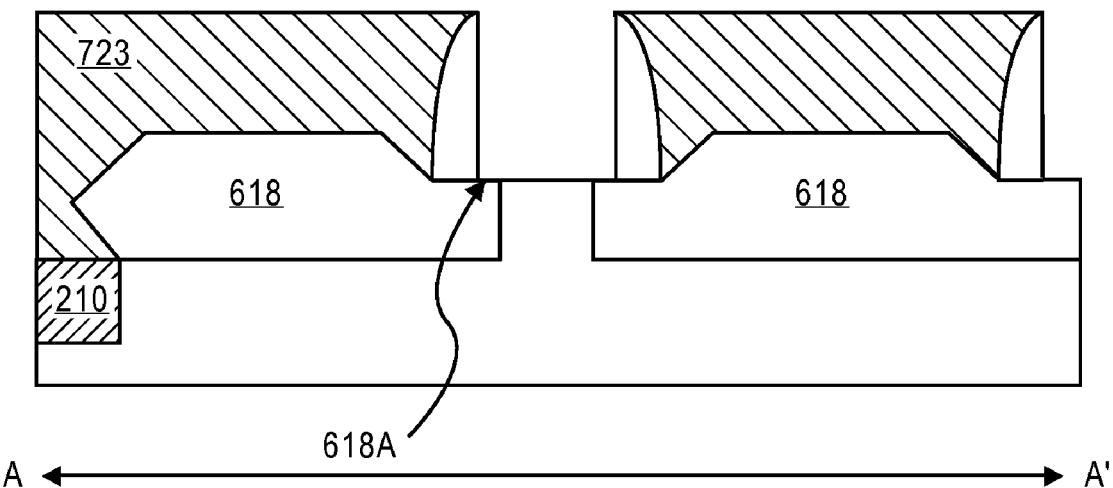
FIG. 8 is a cross-sectional view of a stage in the fabrication of a multi-gate device corresponding to operation 118 in FIG. 1, in accordance with an embodiment of the invention.

Next, for embodiments of the invention in which a replacement metal gate process is used, the gate stack 217 is removed using an etching process at operation 118 to expose the regrown drain/source extension 618A which filled in the extension cavity 421. Methods for removing layers of the gate stack 217 are well known in the art. In alternate implementations, only the gate electrode 213 and gate cap 214 is removed to expose the gate dielectric 212. FIG. 8 illustrates the trench opening that is formed when the gate stack is etched away.

Figure 9:
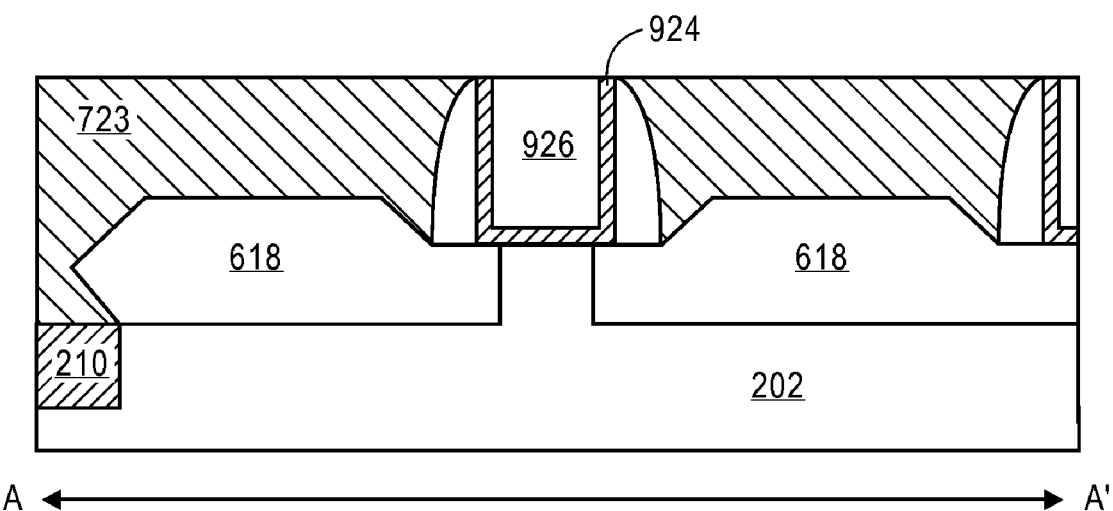
FIG. 9 is a cross-sectional view of a stage in the fabrication of a multi-gate device corresponding to operation 120 in FIG. 1, in accordance with an embodiment of the invention.

Returning to FIG. 1, if the gate dielectric layer is removed, a new gate dielectric layer may be deposited into the trench opening over the channel region 205 at operation 120. The high-k dielectric materials described above may be used here, such as hafnium oxide. The same deposition processes may also be used. Replacement of the gate dielectric layer may be used to address any damage that may have occurred to the original gate dielectric layer during application of the dry and wet etch processes. A metal gate electrode layer may then be deposited over the gate dielectric layer. Conventional metal deposition processes may be used to form the metal gate electrode layer, such as CVD, ALD, PVD, electroless plating, or electroplating. FIG. 9 illustrates a high-k gate dielectric layer 924 and a gate electrode layer 926 that have been deposited into the trench opening such that the regrown drain/source extension 618A is disposed below the gate dielectric layer 924 (either subjacent to a portion of gate dielectric layer 924 in contact with a sidewall of the gate electrode layer 926 and the gate stack spacer 319, or below a portion of the gate dielectric layer 924 disposed subjacent to the gate electrode 926).

The gate electrode layer 926 may consist of a P-type workfunction metal or an N-type workfunction metal, depending on whether the transistor is to be a PMOS or an NMOS transistor. In some implementations, a PMOS transistor is being formed and materials that may be used to form a P-type workfunction metal layer include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV.

Alternately, in some implementations an NMOS transistor is being formed and materials that may be used to form an N-type workfunction metal layer include, but are not limited to, hafnium, zirconium, titanium, tantalum, aluminum, and their alloys, e.g., metal carbides that include these elements, i.e., hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, two or more metal gate electrode layers may be deposited. For instance, a workfunction metal may be deposited followed by a metal gate electrode fill metal such as aluminum metal. Of course, doped polysilicon, silicided silicon, etc., may also be employed in conformance with convention in the art.

Accordingly, a multi-gate transistor with self-aligned epitaxially regrown source/drain regions has been disclosed that reduce the overall resistance of the multi-gate transistor and increase channel strain due to increased doped silicon volume (e.g., boron doped silicon germanium volume) combined with reduced channel silicon volume. The epitaxial source and drain extensions extend approximately the entire fin height Hsi, form an abrupt boundary between the channel region and the source/drain regions, and have a doping concentration that is more easily controlled, yielding a more optimized source-drain profile.

The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is to be determined entirely by the following claims, which are to be construed in accordance with established doctrines of claim interpretation.

What is claimed is:

1. A method of forming a multi-gate transistor, comprising:
    forming a gate stack over a channel region of semiconductor fin having a gate-coupled channel sidewall height ($H_{si}$);
    implanting an etch rate controlling dopant into a source/drain region of the semiconductor fin adjacent to the gate stack;
    etching a doped fin region proximate to the channel region to remove a thickness of the semiconductor fin that is approximately equal to $H_{si}$ and form a source/drain extension cavity that undercuts the gate stack by an amount substantially constant across $H_{si}$ and exposes a semiconductor substrate portion subjacent to a portion of the gate stack;
    etching a region of the semiconductor fin distal from the channel region to remove a thickness of semiconductor that is greater than the thickness removed proximate to the channel region; and
    growing a material on the exposed semiconductor substrate to form a regrown source/drain fin region filling the source/drain extension cavity and extending a length away from the gate stack in a direction substantially parallel to a length of the channel.

2. The method of claim 1, wherein the regrown source/drain fin region is grown to a greatest width, along a dimension parallel to a transistor channel width ($W_{si}$), that is greater than $W_{si}$.

3. The method of claim 1, wherein an etch rate of the doped fin region is higher than an etch rate of the subjacent semiconductor substrate, and wherein the material regrown on the exposed semiconductor substrate contains silicon.

4. The method of claim 1, wherein the undercut length $X_{UC}$ extends below a portion of the gate stack and wherein the undercut length $X_{UC}$ decreases with etch depths greater than the height $H_{si}$.

5. The method of claim 1, wherein the undercut length $X_{UC}$, is constant across the transistor channel width $W_{si}$.

6. The method of claim 1, further comprising:
forming a first pair of spacers on laterally opposite sidewalls of the gate stack and a second pair of spacers on laterally opposite sidewalls of the semiconductor fin subsequent to implanting the dopant, wherein the first pair of spacers are disposed over the implanted regions of the semiconductor fin and the second pair of spacers are disposed adjacent to the implanted regions of the semiconductor fin; and
removing the second pair of spacers prior to growing the material on the exposed semiconductor substrate, the second pair of spacers removed without etching the first pair of spacers enough to expose a gate electrode layer of the gate stack.

7. The method of claim 6, wherein removing the second pair of spacers further comprises an etching performed subsequent to the etching of the doped fin regions.

8. The method of claim 6, wherein removing the second pair of spacers further comprises an etching performed during the etching of the doped fin regions.

9. The method of claim 1, wherein the etching of a thickness greater than $H_{si}$ in the region of the semiconductor fin distal from the channel region comprises recessing the semiconductor substrate below a top surface of an isolation top surface disposed below a portion of the gate stack adjacent to the semiconductor fin.

10. The method of claim 1, wherein the implanting of the dopant comprises implanting at least one of carbon, phosphorous, or arsenic; and wherein the etching the doped fin region comprises a dry etch including a mixture of $Cl_2$ and another compound selected from the group consisting of $NF_3$, HBr, $SF_6$, and Ar.

11. The method of claim 1, wherein the etching of a thickness greater than $H_{si}$ in the region of the semiconductor fin distal from the channel region comprises recessing the semiconductor substrate below a top surface of an isolation dielectric abutting an end of the semiconductor fin most distal from the channel region.

12. The method of claim 1, wherein the substrate is a bulk silicon substrate, wherein growing the material further comprises forming a regrown fin that contains silicon, follows the crystallinity of the substrate and has a lattice spacing that is different than that of the substrate.

13. The method of claim 1, wherein the regrown source/drain fin region is epitaxially grown with formation of {111} facets defining a greatest width, along a dimension parallel to a transistor channel width ($W_{si}$), that is greater than $W_{si}$.

14. The method of claim 13, wherein a width of the regrown source/drain fin is greater than $W_{si}$ at a sidewall height of approximately ½$H_{si}$.

\* \* \* \* \*